(12) United States Patent
Howes et al.

(10) Patent No.: US 8,094,435 B2
(45) Date of Patent: Jan. 10, 2012

(54) MODULAR HIGH-POWER DRIVE STACK SYSTEM AND METHOD

(75) Inventors: Jeremy Howes, Charlotte, NC (US); David Levett, Charlotte, NC (US); John Froeb, Charlotte, NC (US)

(73) Assignee: Parker-Hannifin Corporation, Cleveland, OH (US)

( * ) Notice: Subject to any disclaimer, the term of this patent is extended or adjusted under 35 U.S.C. 154(b) by 1145 days.

(21) Appl. No.: 11/743,735

(22) Filed: May 3, 2007

(65) Prior Publication Data

US 2007/0258219 A1 Nov. 8, 2007

Related U.S. Application Data

(60) Provisional application No. 60/746,293, filed on May 3, 2006.

(51) Int. Cl.
*H02B 13/02* (2006.01)
*H05K 7/20* (2006.01)
*H01R 13/64* (2006.01)
*H02P 27/04* (2006.01)

(52) U.S. Cl. ........ 361/614; 361/611; 361/624; 361/608; 361/676; 361/726; 361/727; 363/131; 363/141; 439/378; 318/370; 318/800

(58) Field of Classification Search .................. 361/611, 361/614, 624, 608, 676, 730, 724–727, 636–637; 363/131, 141, 144; 200/50.01

See application file for complete search history.

(56) References Cited

U.S. PATENT DOCUMENTS

| | | | | |
|---|---|---|---|---|
| 4,305,114 A | * | 12/1981 | Takagi et al. | 361/614 |
| 4,558,914 A | | 12/1985 | Prager et al. | |
| 5,245,527 A | * | 9/1993 | Duff et al. | 363/131 |
| 5,493,194 A | | 2/1996 | Damiano et al. | |
| 5,648,892 A | | 7/1997 | Wieloch et al. | |
| 5,905,631 A | * | 5/1999 | Winkler | 361/641 |
| 5,930,112 A | | 7/1999 | Babinski et al. | |
| 6,205,029 B1 | * | 3/2001 | Byrne et al. | 361/724 |
| 6,310,783 B1 | * | 10/2001 | Winch et al. | 361/797 |
| 6,459,589 B2 | | 10/2002 | Manweiler et al. | |
| 6,869,320 B2 | | 3/2005 | Haas et al. | |
| 6,937,461 B1 | | 8/2005 | Donahue, IV | |
| 7,379,305 B2 | * | 5/2008 | Briggs et al. | 361/727 |
| 7,417,848 B2 | * | 8/2008 | Bergmann et al. | 361/624 |
| 7,511,946 B2 | * | 3/2009 | Malkowski et al. | 361/648 |
| 2002/0136042 A1 | * | 9/2002 | Layden et al. | 363/146 |
| 2011/0122549 A1 | * | 5/2011 | Coffey et al. | 361/624 |

* cited by examiner

*Primary Examiner* — Zachary M Pape
(74) *Attorney, Agent, or Firm* — Renner, Otto, Boisselle & Sklar, LLP

(57) ABSTRACT

A power drive stack system comprises a series of power electronic modules, each one of the modules containing power components and module contacts electrically and mechanically aligned for building a portion of a complete AC/DC drive stack. The modules utilize a common set of circuit connection points that are matched to a common set of physical connection points. The modules can be plugged together like building blocks to form a large variety of AC/DC drive stacks that can be tailored to meet an exact system requirement. The drive stack may be used in conjunction with a controller to adjust the torque and speed of an AC/DC electric motor.

27 Claims, 10 Drawing Sheets

Front View

Rear View

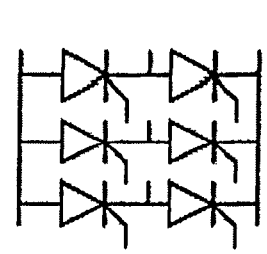
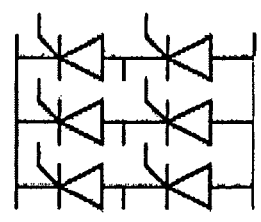
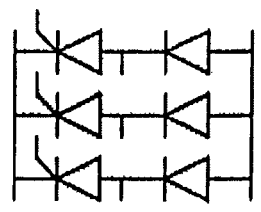
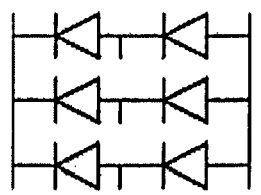
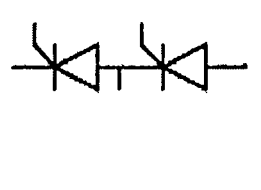
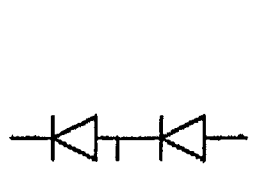
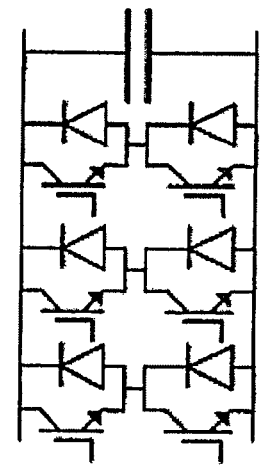
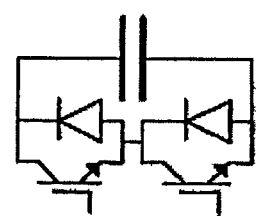
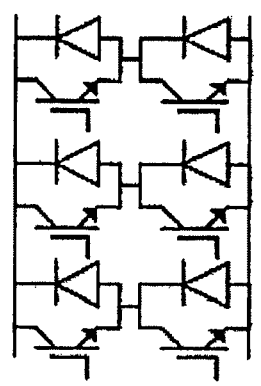
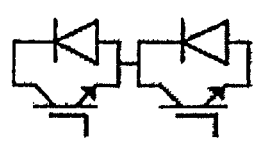
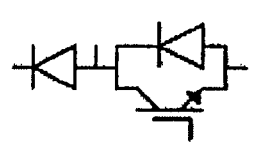
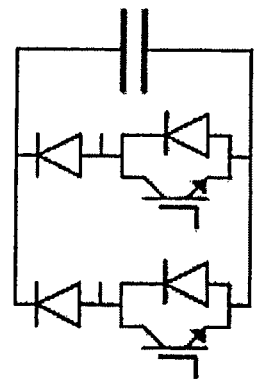
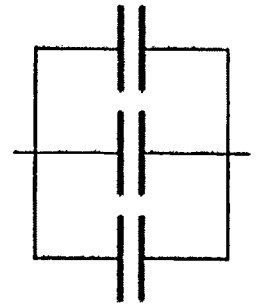
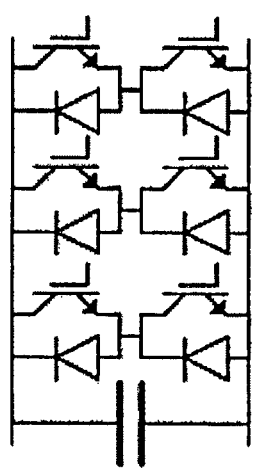
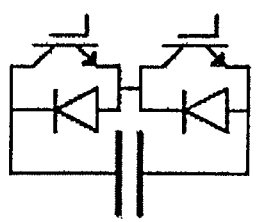
FIG. 12A  FIG. 12B  FIG. 12C  FIG. 12D  FIG. 12E  FIG. 12F  FIG. 12G  FIG. 12H  FIG. 12I  FIG. 12J  FIG. 12K  FIG. 12L  FIG. 12M  FIG. 12N  FIG. 12O  FIG. 12P

MODULAR HIGH-POWER DRIVE STACK SYSTEM AND METHOD

RELATED APPLICATIONS

This application claims the benefit of U.S. Provisional Application No. 60/746,293 filed May 3, 2006, which is incorporated herein by reference.

FIELD OF THE INVENTION

The invention herein described relates to power electronic modules that can be connected together to form a variety of configurations of power electronic alternating current (AC) or direct current (DC) motor drive stacks, and more generally to a system and method for a modular motor drive stack and/or uninterruptible power supplies that are pluggable and scalable for use in a variety of applications.

BACKGROUND

High-power drive stacks are used in a wide variety of applications. Such applications include for example, driving a motor, regenerating energy from a windmill or other renewable power source back to a distribution line, braking systems for large inertia objects (e.g., large wheel), etc.

A conventional high power drive stack is a monolithic unit that typically includes electronic controls, power components, and cooling components. The power components generally include an input rectifier, IGBT bridge module, and a dynamic brake switch. The power components are generally coupled to the cooling components, which may include a heat sink and/or a cooling fan.

A variation in the monolithic design, discussed above, is to divide the high-power drive stack into several different units. In such case, the drive may be divided into three separate units (e.g., input rectifier unit, brake unit and inverter unit). The units may be connected together by cables and/or bus bars, and are mounted in separate enclosures.

A further refinement to the above prior art systems is to provide a drive that is divided up into different units, with the drives consisting of two common electric connection points (e.g., DC+ and DC−). In addition, such units may also provide that these connection points align mechanically, which enables the units to be modular and connect together using two straight bus bars, when a plurality of drive units are connected together. There are a variety of drawbacks associated with such prior art devices. For example, there are only two common electrical connection points. All other connections generally have to be made by hard wiring the connection directly to the device. Many such devices are not pluggable and/or removably insertable, which makes removing, repairing, and installing the device difficult and time consuming.

In addition, many of the devices include complete units that have been designed to fit together and share two common bus connections. Each unit is a complete drive and may operate on its own. In such case, the device has its own controller embedded and custom input/output connections, which substantially limits the configurability of the device(s).

SUMMARY OF THE INVENTION

The present invention addresses the above problems by subdividing a high-power drive into a series of different power electronic modules. The modules are interchangeable having a variety basic of power electronic building blocks of various power electronic modules that can be configured. The interchangeable basic power electronic building blocks can be used to make a large number of different drives or complete systems.

One aspect of the invention relates to a high power drive stack system comprising: a common support structure having a plurality of receivers located in predetermined locations, wherein at least some of the receivers have at least one receiver contact and the at least one receiver contact has a predetermined position in one of the receivers; at least one module including a power component and at least one module contact, wherein the at least one module contact is arranged in the predetermined position and coupled to at least a portion of the power component; and a plurality of couplers selectively coupled to the at least one receiver contact to configure the at least one module to perform one or more high power functions.

Another aspect of the invention relates to a high power electronic stack system comprising: a plurality of power electronic modules, each module having a power component and a plurality of module contacts that engage with a plurality of receiver contacts and/or couplers, wherein the module contacts are arranged in a predetermined configuration corresponding to a plurality of common signals that allow the plurality of modules to be configured to form one or more high power circuits by one or more couplers selectively coupled to at least some of the plurality module contacts.

Another aspect of the invention relates to a power electronic module comprising: a housing; a power circuit component at least partially housed within the housing; a plurality of module contacts selectively coupled to the power circuit, wherein the plurality of module contacts are mechanically and electrically positioned in a predetermined configuration to allow the power electronic module to be configured with one or more additional power electronic modules to form at least one high power circuit.

Another aspect of the invention relates to a method of performing one or more high power functions, the method comprising: providing the high power plurality of power electronic modules, wherein each of the power electronic modules includes a power component and a plurality of module contacts, wherein the module contacts are mechanically and electrically aligned with a plurality of receiver contacts secured to a common support structure; configuring the plurality of power electronic modules by coupling one or more connectors to one or more of the module contacts; and controlling the plurality of power electronic modules with a controller, wherein the controller is located remotely from the plurality of power electronic modules and the controller controls operation of the power component, wherein the controller to perform the one or more high power functions.

Further features of the invention will become apparent from the following detailed description when considered in conjunction with the drawings. In addition, while a particular feature of the invention may have been described above with respect to only one or more of several illustrated embodiments, such feature may be combined with one or more other features of the other embodiments, as may be desired and advantageous for any given or particular application.

BRIEF DESCRIPTION OF THE DRAWINGS

In the annexed drawings,

FIGS. 12A-12P are exemplary power components in accordance with aspects of the invention.

DETAILED DESCRIPTION

Figure 1:
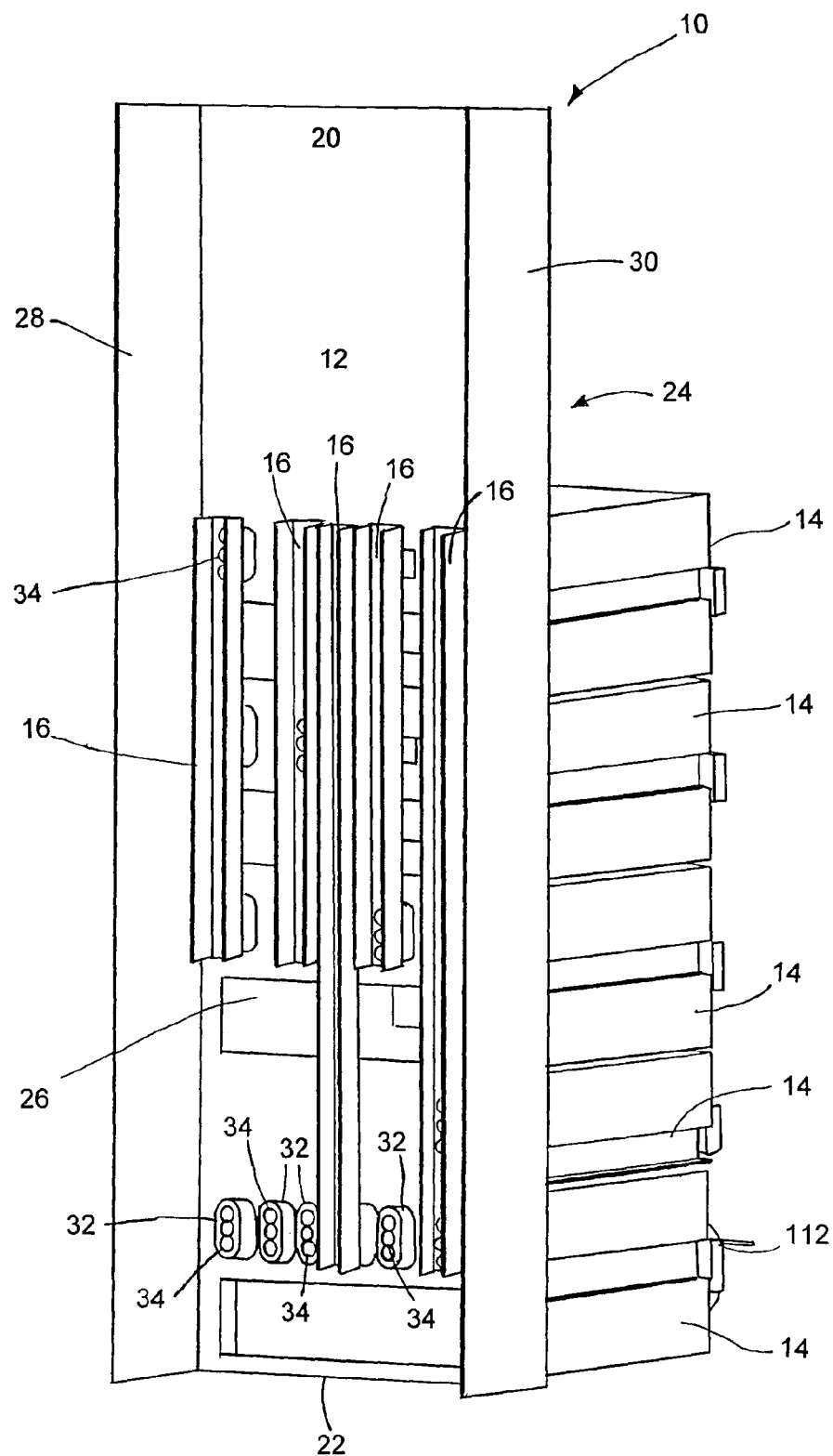
FIG. 1 is a perspective view of an exemplary high power electronic stack system in accordance with aspects of the invention.

Referring now in detail to the drawings and initially to FIG. 1, an exemplary high power drive stack system 10 according to the invention is illustrated. The high power drive stack 10 includes a common support structure 12, a plurality of power electronic modules 14 and a plurality of couplers 16. As used herein, the phrase "high power" means a circuit having a voltage of more than 50 V AC or 120 V DC or a current above 50 Amps.

The common support structure 12 may be any suitable storage structure. For example, the common support structure 12 may be a rack storage system, as shown in FIG. 1. The common support structure 12 can be fabricated from steel or aluminum (or any other suitable material) and may optionally include parallel vertical rails or rack rails for storing one or more components (e.g., modules 14). The common support structure 12 generally includes a top 20, bottom 22, front 24, rear 26 and sides 28 and 30. The common support structure is generally configured to provide stable support for each of the components stored in the common support structure 12. The common support structure 12 may also be secured to a floor, wall and/or ceiling for additional support. As one of ordinary skill in the art will readily appreciate any suitable rack for supporting electronic equipment thereon may be used in accordance with the present invention. In addition, while the common support structure 12 is illustrated for stacking modules 14 in a vertical orientation, it will be readily appreciate that a suitable common support structure 12 may also be suitable for storing the components in a horizontal orientation.

Figure 2:
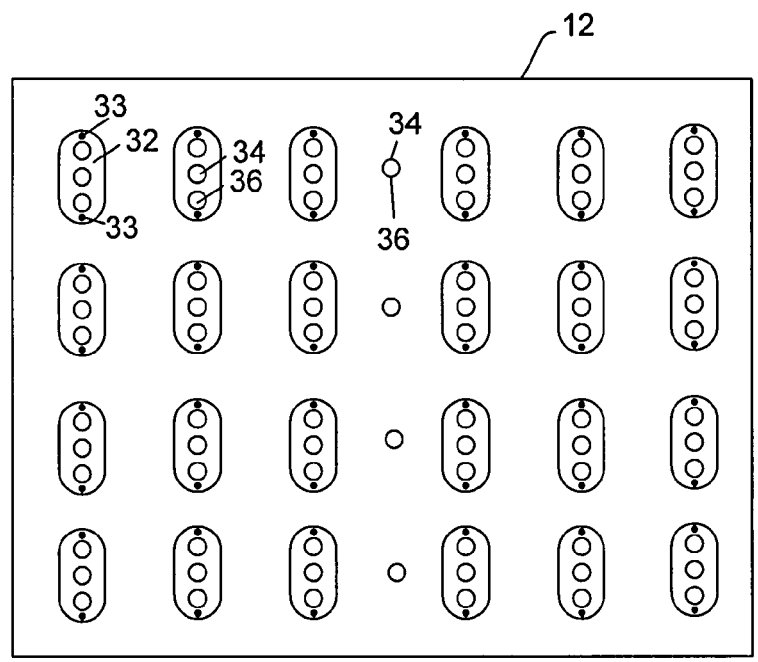
FIGS. 2 and 3 are exemplary front and rear views of a plurality of receivers secured to a common support structure in accordance with aspects of the invention.
Figure 7A:
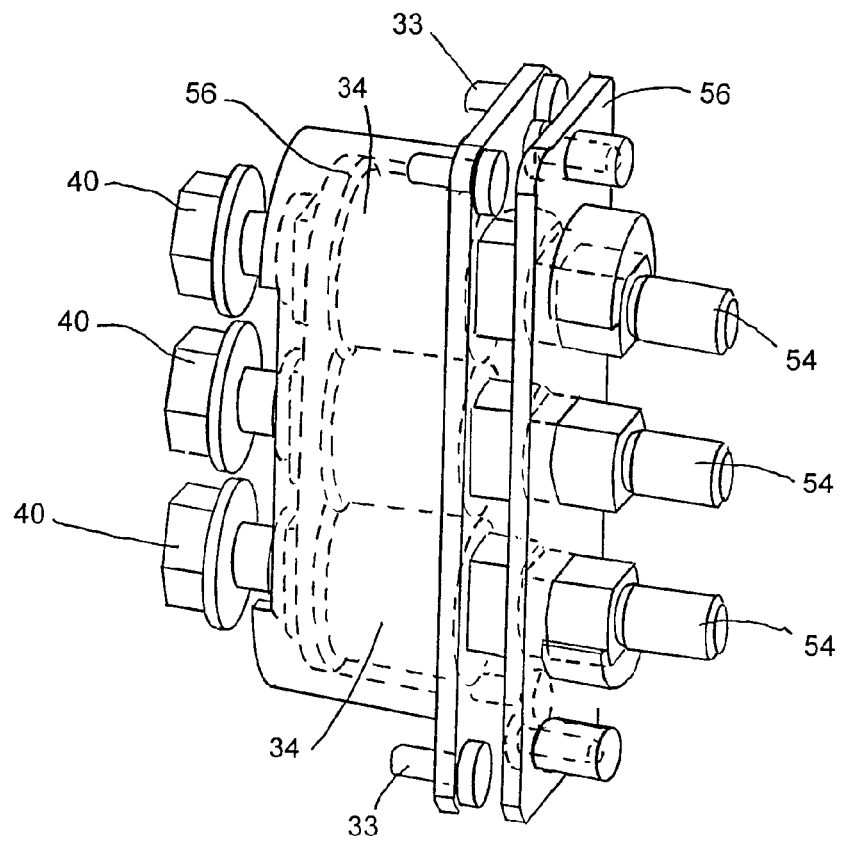
FIG. 7A is an exemplary perspective view of a module engaged with a receiver in accordance with aspects of the invention.
Figure 7B:
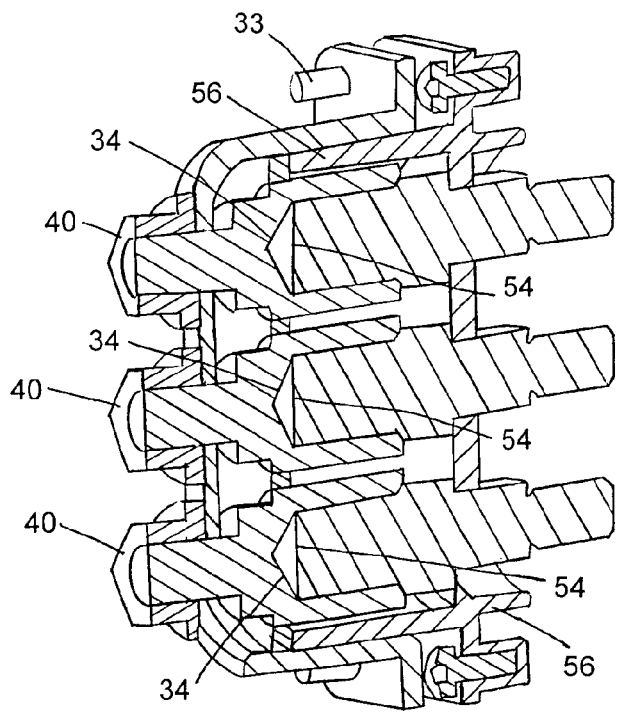
FIG. 7B is cross-section view of FIG. 7A.

The common support structure 12 also includes a plurality of receivers 32. As shown in FIG. 2, the receivers 32 are secured to the common support structure 12 at predetermined locations. The receivers 32 may be secured to the common support structure in any desirable manner. For example, the receivers 32 may be secured to the common support structure 12 by a fixation element 33, as shown in FIGS. 7A and 7B. Exemplary fixation elements 33 include, a screw, a nail, an adhesive, a rivet, etc. In addition, the receivers 32 may be formed in the common support structure 12.

The receivers 32 generally include one or more receiver contacts 34. The receiver contacts 34 include a first portion 36, as shown in FIGS. 2, 7A and 7B, for engaging with contacts from the power electronic modules 14 and a second portion 38 for selectively engaging with a coupler 16, as described below. The first portion 36 of the contacts 34 may be a female connector or a male connector. Depending on the configuration of modules, as shown in FIG. 2, the number of receiver contacts 34 may vary. For example, one receiver may have two receiver contacts and another receiver may have more or less receiver contacts. Generally, the number of receiver contacts is dependent on the configuration of the module 14 that may be secured to the receiver 32.

Figure 3:
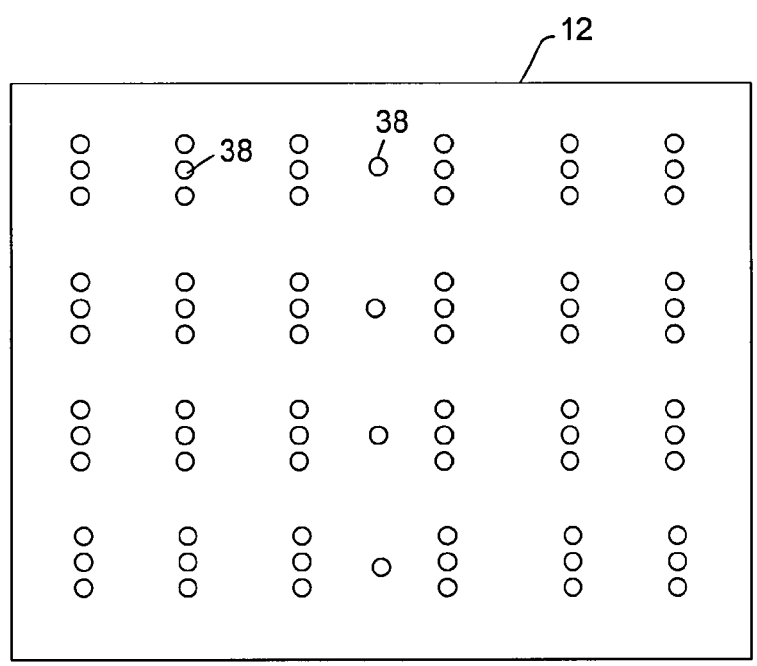

Referring to FIG. 3, the second portion 38 of the receiver contact is shown. The second portion of the receiving portion 38 may be any desirable connector that is capable of selectively securing the coupler 16 onto the second portion 38 of the receiver contact 34. In one embodiment, the second portion 38 of the receiver contact 34 may be a threaded rod that is capable of accepting a securing mechanism 40, e.g., see FIGS. 7A and 7B, to selectively secure the coupler 16 to the receiver contact 34. The securing mechanism 40 may be any suitable component that is capable of securing the coupler 16 to the receiver contact 34. Exemplary securing mechanisms include a nut, a fastener, etc.

Figure 4:
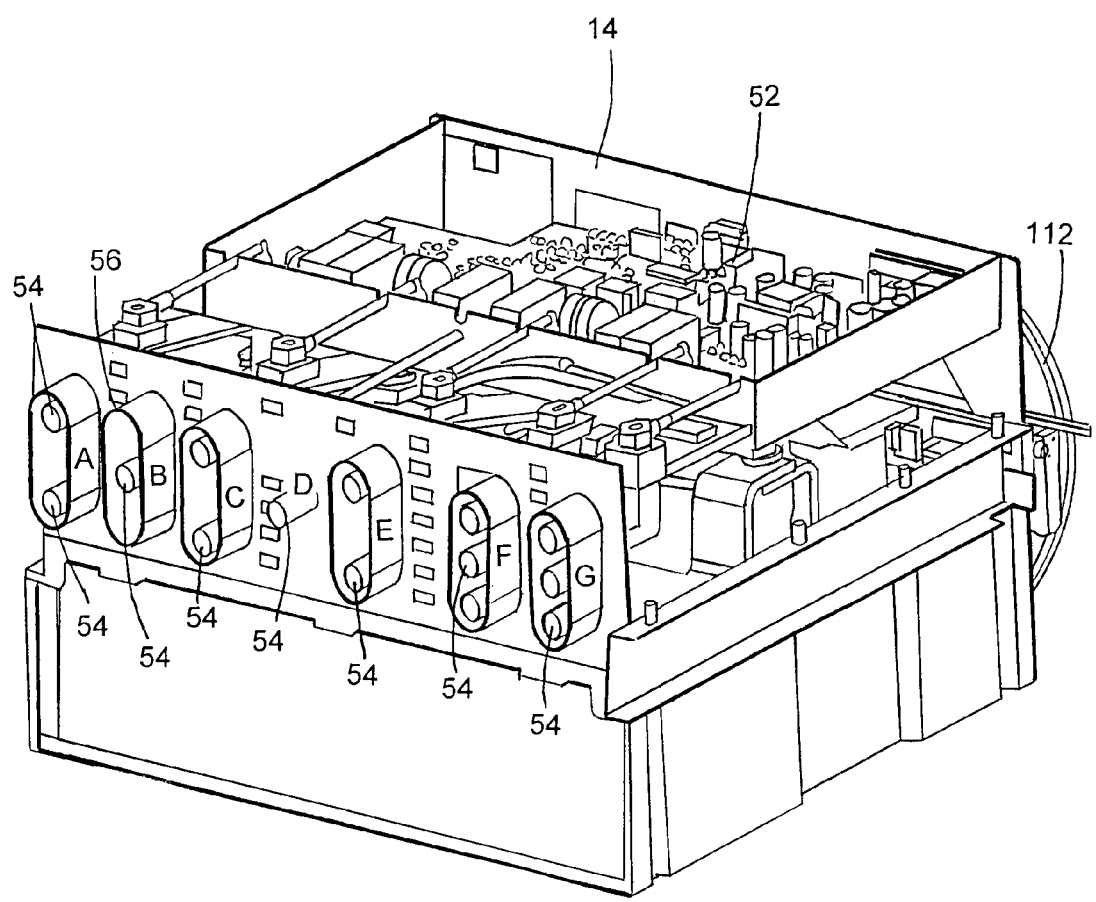
FIG. 4 is an exemplary perspective view of a module in accordance with aspects of the invention.

Referring to FIG. 4, an exemplary module 14 is illustrated. The module 14 may also be referred to herein as a power electronic modules. The module 14 includes a housing 50 (shown in FIG. 1). The housing 50 may be made of any suitable material, e.g., steel, aluminum, plastic, etc. The module 14 includes a power component 52 and a plurality of module contacts 54. The power component 52 may be any circuit that assists in the performance of one or more high power functions 52, as described below. The power component 52 and the module contacts 54 are generally housed at least partially in the housing 50. In one embodiment, the module contacts 54 protrude outward from the housing 50. The module contacts 54 may also be at least partially enclosed by an engagement structure 56. The engagement structure 56 may assist in inserting the module contacts 54 into the couplers 16 and/or receivers contacts 34. The engagement structures 56 may also couple to the receivers 32.

As shown in FIG. 4, the module contacts 54 may grouped in a predetermined configuration to align with other modules. In addition, as described below, the module contacts are grouped together based upon their signals. For example, reference A may correspond to AC1, reference B may correspond to AC2, reference C may correspond to I/O #1, reference D may correspond to ground, reference E may correspond I/O #2, reference F may correspond to DC− and reference G may correspond to DC+. One of ordinary skill will appreciate that these signals are exemplary and not intended to limit the scope of the present invention.

As shown in FIG. 4, the number of module contacts 54 may vary depending on wide variety of parameters, including, e.g., desired input/output voltage, desired input/output amperage, application, circuit configuration, etc.

Each module 14 is highly configurable to have a variety of circuitry that utilizes a power component 52 from one or more of the modules 14 to perform a high power function to used to build a complete AC and/or DC drive stack. The drive stack can then be used in conjunction with a controller to adjust the torque and speed of an AC/DC electric motor. The modules 14 can be plugged together like building blocks to form a large variety of AC/DC drive stacks that can be tailored to meet an exact system requirement.

The module contacts 54 generally correspond to a common set of circuit connection points (e.g., common signals) and physically matching the connections, which allows the modules to be releasably insertable and/or pluggable together to form a wide variety of drive stacks that can be tailored to meet an exact system requirement.

Figure 5:
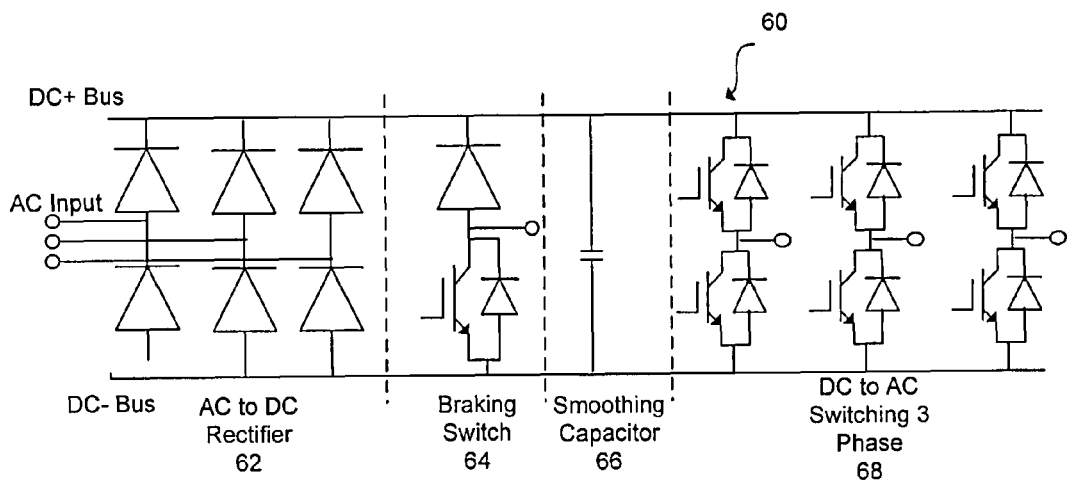
FIG. 5 is a schematic diagram of an exemplary circuit.

The modules 14 that comprise the high power drive stack 10 are modular. Referring to FIG. 5, an electrical circuit 60 of a typical AC variable speed motor drive power electronics stack is illustrated. FIG. 5 illustrates four main groupings of power components in the power section: (a) input rectifier section 62 which takes a three-phase AC voltage and converts it to a dc (direct current) supply voltage; (b) a DC capacitor section 64 that smooths the rectified DC voltage; (c) a braking power switch 66 that allows energy to be dissipated in an external resistor from the DC supply; and (d) a three-phase output switching section 68 that modulates the DC voltage back to a variable frequency three phase AC supply used to drive a motor.

Figure 6A:
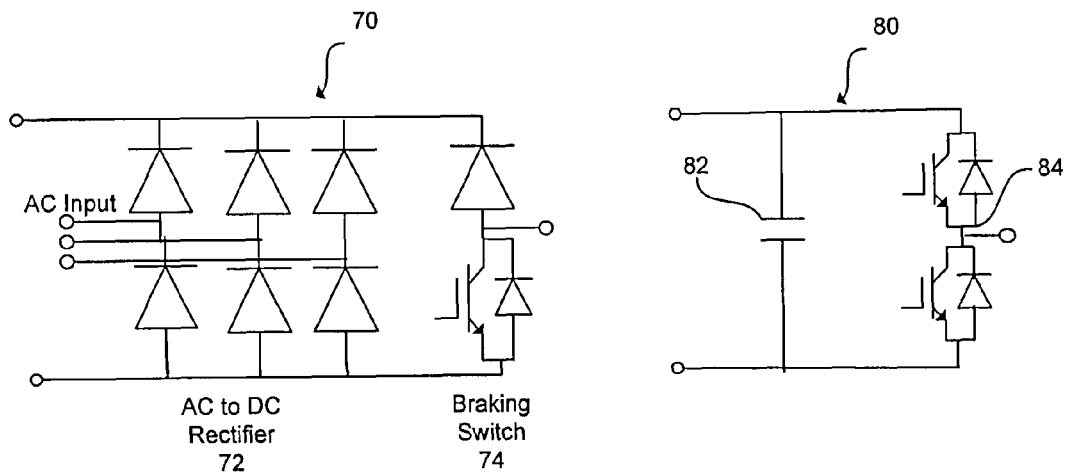
FIGS. 6A and 6B are schematic diagrams of an exemplary circuit in accordance with aspects of the invention.
Figure 6B:
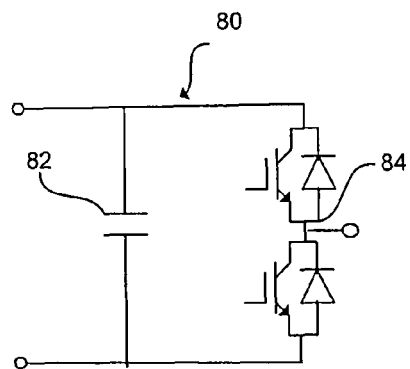

An aspect of the present invention relates to dividing this standard circuit into separate power blocks or modules 14. FIG. 6(a) schematically illustrates an example of how such a circuit may be subdivided into different functional blocks. FIG. 6(a) illustrates a configuration 70 that combines an input rectifier 72 and braking power switch 74. Another schematic configuration 80 is illustrated in FIG. 6(b), which combines the DC capacitor section 82 with one pole of the three-phase output 84. One of ordinary skill in the art will readily appreciate that there are numerous other possible divisions, for example, a single block with a DC capacitor section, a single block with just the three-phase output section, a single block with the braking power switch, or a combination of the DC capacitor with the braking power switch, etc. to construct a desired circuit, as shown in FIGS. 12A-12P.

As stated above, the modules 14 include a set common circuit connection points (also referred to as common signals that are grouped together) that may be utilized in many design applications. For example, the common circuit connection points (also referred to as common signals) may be AC+, AC−, DC+, DC−, Ground, I/O input #1, I/O input #2, etc. One of ordinary skill in the art will readily appreciate that the connection points (common signals) discussed above are exemplary in nature and modification of the selected signals, e.g., selecting other signals, few signals, more signals, etc., may be used in accordance with the present invention.

The modules 14 are made modular by selecting a series of common electrical circuit connection (common signals) and physically aligning these with a common physical location inside each of the modules. These electrical and mechanical points are the same for all modules in the range. In other words, the modules for a particular system are electrically and mechanically aligned to each other. For example, referring back to FIG. 4, each of the module contacts 54 associated with a common signal and/or connection point are grouped together and substantially linearly aligned in a vertical direction and/or horizontal direction (not shown) for engagement with corresponding receiver contacts 34.

The housing 50 generally combines into a common enclosure that has the same size and shape regardless of which power component 52 are selected for each of the modules. The result is a family of power electronic modules 14 that are inter-changeable in terms of their size, shape and functions.

The separate modules 14 generally need to be electrically connected for a complete drive perform a high power function. Due to the high current requirements, couplers 16 are generally used to selectively inter-connect the various modules 14. The couplers 16 may take any desirable form. Generally the couplers 16 are in the form of bus bars. The connections between the modules 14 and the coupler 16 may be made through the receiver contacts 34 of the receiver 32 or directly from the coupler 16 to the module contacts 54. In one embodiment, the module contacts 54 are male and the female socket on the coupler 16 or the receivers 16. While the couplers, receiver contacts and module contacts have been described in terms of male and/or female connections, one of ordinary skill in the art will readily appreciate the connections may be interchangeable, i.e., the connectors may be interchangeable.

FIG. 7A illustrates a perspective view of the mating engagement between the receivers 32 and module contacts 54. As shown, the receiver 32 and receiver contacts 34 may be female receptacles that receive the module contacts 54, which are male pins. Optionally, the receiver 32 may also receive engagement structure 56. FIG. 7B is a cross-section view of FIG. 7A. As illustrated in FIGS. 7A and 7B, the receiver 32, which houses the three way receiver contacts 34 is used to align and engage with the three module contacts 54. Each module contact 54 and receiver contact 34 coupled thereto is generally capable of carrying a predetermined electrical characteristic and the number of module contacts 54 may be determined based on application needs. For example, if each module contact 54 is able to carry approximately 350 Amps, a three pin configuration, as shown in FIG. 7 may carry current up to 1000 Amps (1050 Amps), with each pin of the connector capable of carrying approximately 350 Amps.

The module contacts 54 are generally mounted in the module 14 and the mating portion is located in the receiver 32, which is secured to the common support structure 12. Again, the module 14 is designed to fit into the common support structure 12 so that the pins and sockets align mechanically. The assembly is designed with three poles operating in parallel to carry a maximum current of 1000 Amps. For lower power modules module contacts (also referred to herein as "plugs" or "power plugs") can be removed to match the current requirements of the particular module and/or application.

The combination of the receiver contacts 34 and couplers 16 (e.g., bus bars) along with the module contacts 54 enable the modules 14 to be easily installed and serviced without having to undo or remove any high-voltage or high-current power connections. The high-power connections are highly reliable, and repairing, replacing and/or otherwise servicing the modules 14 is safe, quick and eliminates the need for special tools.

The modules 14 are all generally the same physical size, therefore the module contacts 54 (e.g., power plugs) can be in the same physical location for each module. In addition, the selection of a set of common electrical connection points that can be utilized by all of the different power electronic modules, as discussed above, makes the system robust and easily configurable to perform a wide range of high-power operations and/or functions. Because of these two elements a common bus bar rail system can be used. In addition, each different type of module can have the module contacts (e.g., power plugs) loaded, partially loaded or left empty to make the appropriate connections for its circuit. Accordingly, each module 14 can connect to every other module via the same bus bar system to construct the required complete drive circuit.

Figure 8:
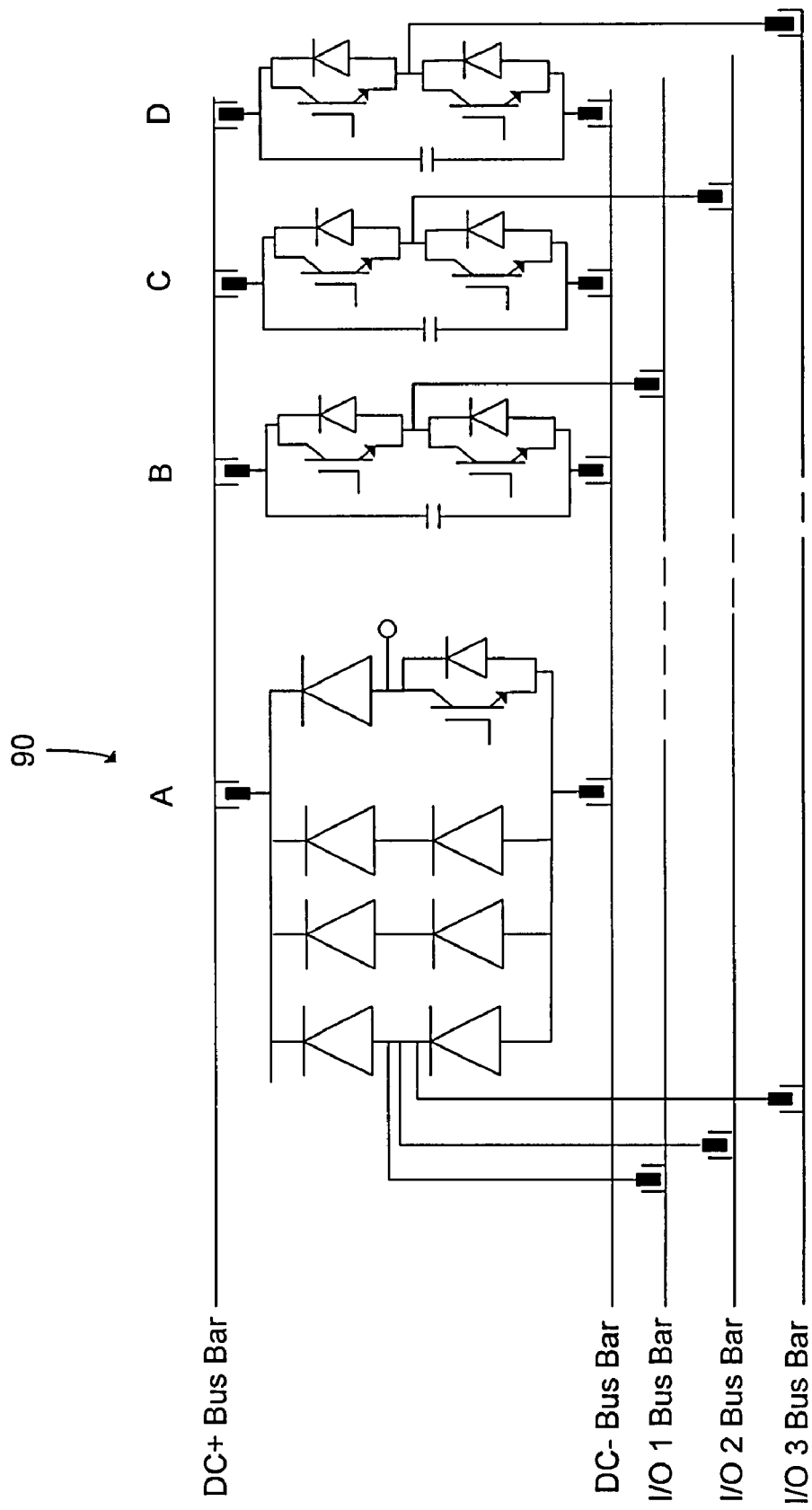
FIG. 8 is an exemplary schematic diagram of a high power circuit configured in accordance with aspects of the invention.

FIG. 8 illustrates an exemplary circuit 90 forming a complete drive system to perform one or more high power functions using a five bus bar rail system, and four of the power electronic modules (A-D). As shown in FIG. 8, Reference A refers to a rectifier and braking switch module and References B-D illustrate three capacitor and single output pole modules. Note the circuit configuration shown in FIG. 8 is exemplary in nature. Aspects of the present invention may include more or fewer bus bar rails depending on a particular application. For example, two extra bus bars may be added to system shown in FIG. 8, one for a ground connection, which may be required for all the modules and another for a dynamic brake module output.

In most prior art variable speed controllers, the control electronics, which generate a firing pattern to produce the required motor torque and speed, are physically located with the power electronics stack. In order to enable a high level of flexibility in using and mounting the power modules 14, one aspect of the present invention relates to remotely mounting the control electronics from one or more power modules 14. The power modules 14 have electronic protection circuits built in to prevent failure under abnormal operating conditions, but the firing commands are generated in a remote location separate from the power modules 14.

Figure 9:
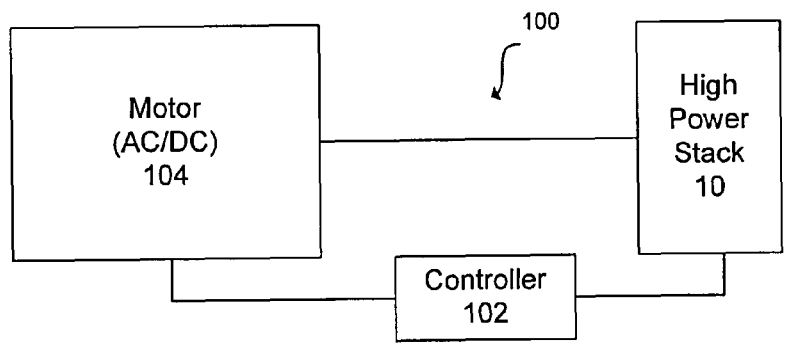
FIG. 9. Is an exemplary system in accordance with aspects of the invention.

Referring to FIG. 9, an exemplary drive stack system 100 is shown. The system 100 includes a high power drive stack 10, a controller 102 and a motor 104. The high power drive stack 10 is substantially the same as discussed above. Each module 14 that comprises the drive stack 10 includes a control interface unit 106 that may receives and/or transmit information to the controller 102. The controller 102 is configured to control operation of the motor 104 by sensing information from the motor 104 and/or high power drive stack 10 and transmitting corresponding commands to one or modules 14 in the high power drive stack 10 to perform a high power function and/or operation. A computer may be connected to the controller 102 for programming, controlling and/or monitoring purposes.

In addition to being modular and pluggable, the high power drive stack 10 is also scalable. As used herein scalable means that a larger number of modules can be used together to form more complex systems of more than one drive or more than one configuration of power electronic modules. Scalability is obtained generally by lengthening and/or extending the length of the couplers 16 (e.g., bus bars) so that more modules can be added. That is, the longer the coupler 16, the more modules can be connected to the coupler 16.

In addition to lengthening the coupler 16, another aspect of the invention relates to providing a cooling system that is independent of the number of modules used. Prior art systems may use a single fan that cools the heat sinks for all the power dissipating devices. This approach has the advantage that only one fan is required. However it has two disadvantages for use in a scalable system. First, the more heat sinks in the stack, the higher the back pressure on the fan. This results in either a reduced airflow or requires a higher power fan to be used. Secondly, the air is progressively heated as it passes through each heatsink. Therefore, the last heatsink, running in preheated air, will not have the same cooling performance as the first heatsink, which is fed by ambient air. This is generally known as thermal stacking.

Figure 10A:
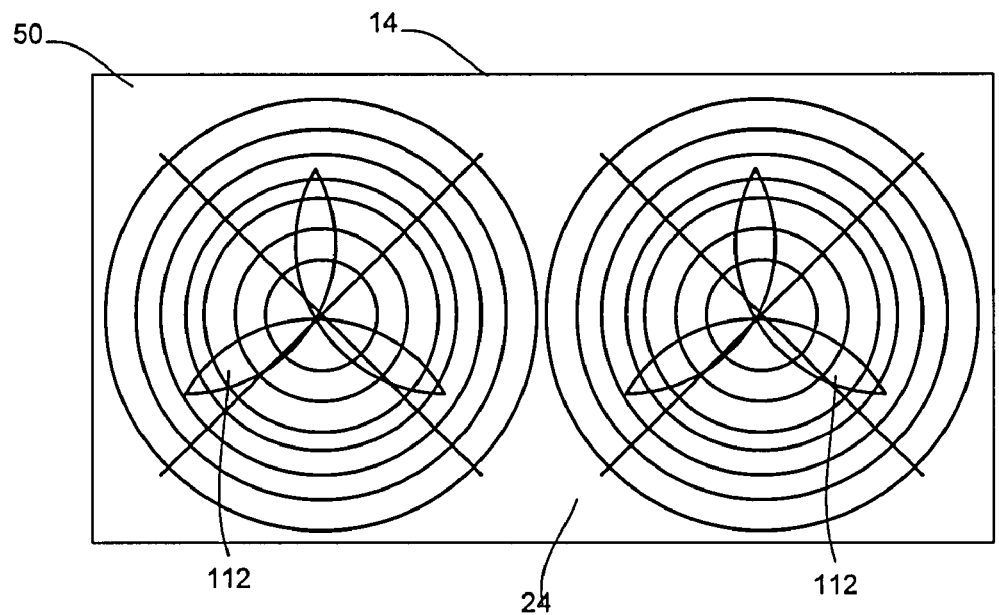
FIGS. 10A and 10B are front and side views of an exemplary module in accordance with aspects of the invention.
Figure 10B:
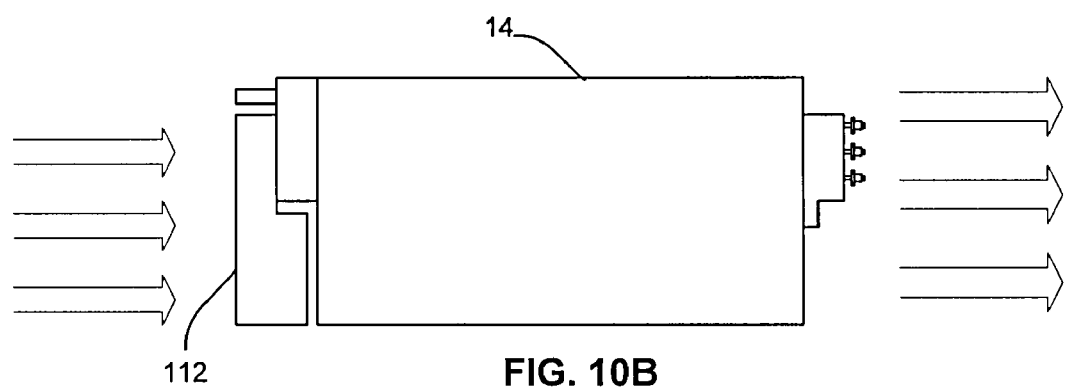

Aspects of the present invention relate to using one of two cooling systems. First a back-to-front air cooled design is shown in FIGS. 10A and 10B. Each power electronics module 14 is generally provided with a suitable number of fans 112, e.g., see FIG. 4, required to cool that module and draws air from the front, over the heat sink (not shown) into a plenum (not shown) at the back of the module 14. This has the advantage that as long as the plenum is large enough, adding modules does not significantly increase the back pressure on the fans. Also, there is no thermal stacking, since the entry air to each module is at ambient temperature.

Alternatively, heat generating components can be mounted on a liquid cooled cold plate. This enables a large number of modules to be connected together in one contiguous system with no thermal stacking or reduction in cooling performance. It also enables the system to be mounted vertically, horizontally or flat depending on the user's preferences.

FIGS. 11A-F shows a sample of the different drive configurations that can be designed and built using this the above described system. FIGS. 11A-F shows the electronic circuit of six (6) different individual drive stack configurations that may be implemented for high power functions and/or operations using one or more of the power components 52 associated with the one or more module 14. FIGS. 12A-P illustrate exemplary power components 52 that can be implemented in the one or more modules to form or otherwise implement the high power functions and/or operations. For example: FIG. 12A illustrates a single-pole rectifier, FIG. 12B a single-pole half controlled rectifier, FIG. 12C a single-pole fully controlled rectifier, FIG. 12D a three-phase rectifier, FIG. 12E a three-phase half controlled rectifier, FIG. 12F a three-phase fully controlled rectifier, FIG. 12G a three-phase fully controlled line regenerative bridge; FIG. 12H a single dynamic braking switch, FIG. 12I a single pole for an output bridge, FIG. 12J a three-phase output bridge, FIG. 12K a single-pole for an output bridge with capacitor, FIG. 12L a three-phase output bridge with capacitor, FIG. 12M a single-pole of an active regenerative bridge with capacitor, FIG. 12N a three-phase active regenerative bridge with capacitor, FIG. 12O a capacitor module, and/or FIG. 12P a dual dynamic brake switch with capacitor. One of ordinary skill in the art will appreciate that these drive configurations are exemplary in nature and not intended to be limiting.

Figure 11:
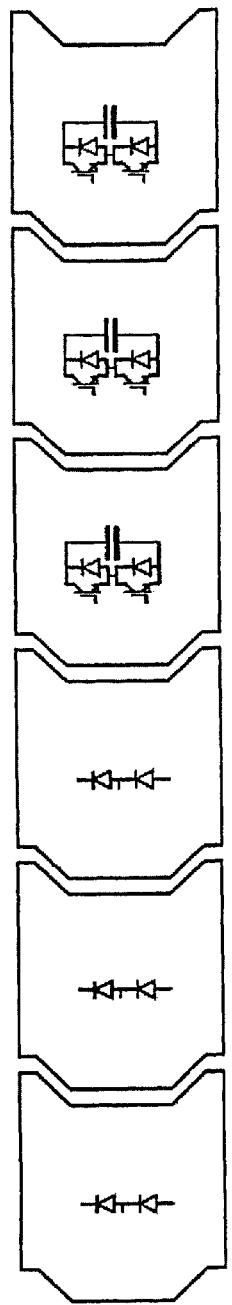
FIGS. 11A-11F are exemplary drive stack system configurations and/or functions in accordance with aspects of the invention.
Figure 11:
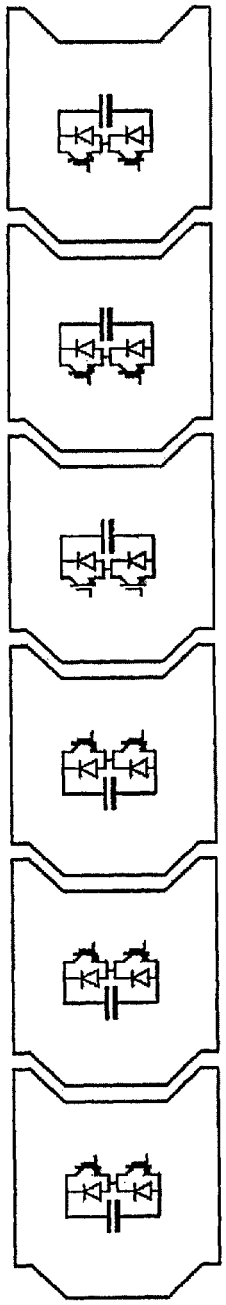
Figure 11:
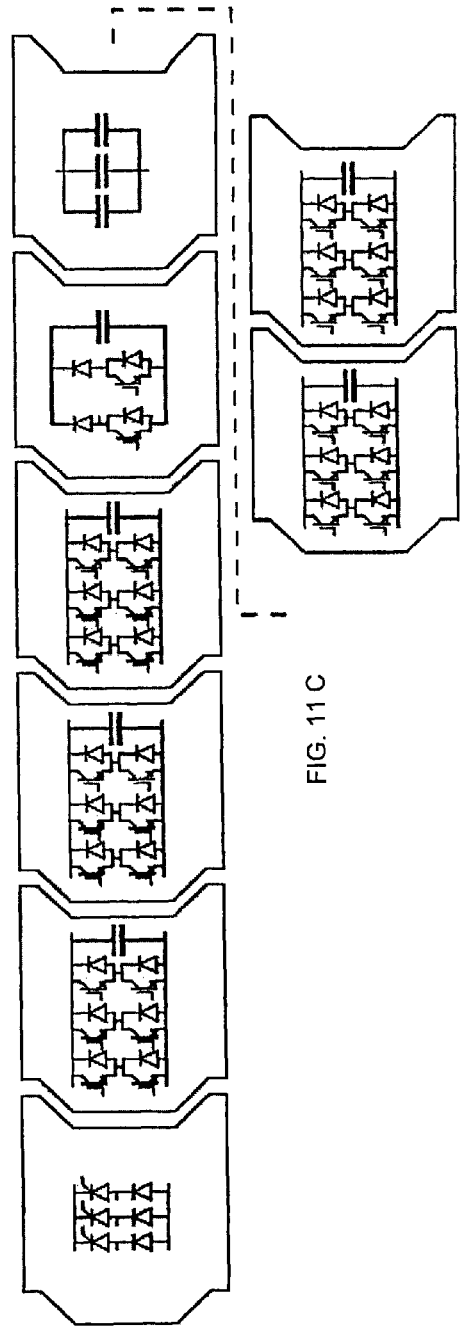
Figure 11:
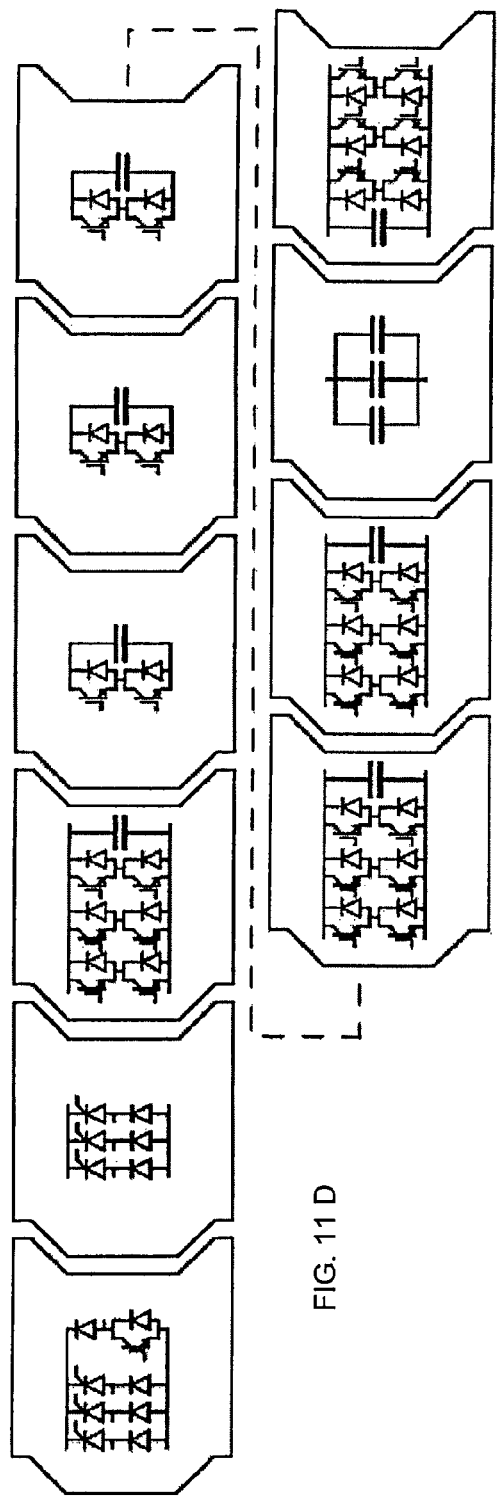
Figure 11:
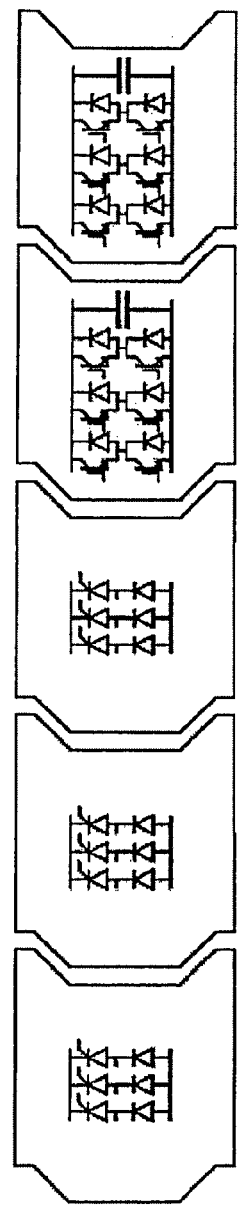
Figure 11:
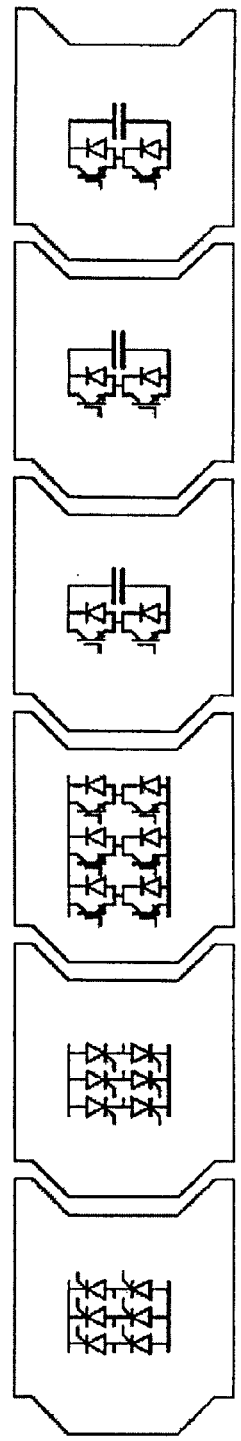

Referring to FIG. 11A-F, exemplary circuit diagrams of six different types of drives or drive systems that could be assembled using this family of power electronic modules and bus bars is illustrated. For example, FIG. 11A refers to a single high power drive with triple module bridge rectifier, FIG. 11B refers to a single high power drive with full regenerative front end rectifier, FIG. 11C refers to a system with five small drives, additional capacitance for improved power loss ride-through, dynamic braking and half controlled input rectifier, FIG. 11D refers to a system with three low power drives and one high power drive. Extra capacitor module for improved loss ride through capacity, six phase and 12 pulse half controlled rectifier, a dynamic brake switch, and a regenerative low power braking module; FIG. 11E refers to a dual small drive system with nine phase and 18 pulse half controller rectifier; and FIG. 11F refers to a single high power and single low power drive with thyristor rectifier and line regenerative thyristor module.

In summary, a power drive stack system is disclosed. The power drive stack system comprises a series of power electronic modules, each one of the modules containing power components and module contacts electrically and mechanically aligned for building a portion of a complete AC/DC drive stack. The modules utilize a common set of circuit connection points that are matched to a common set of physical connection points. The modules can be plugged together like building blocks to form a large variety of AC/DC drive stacks that can be tailored to meet an exact system requirement. The drive stack may be used in conjunction with a controller to adjust the torque and speed of an AC/DC electric motor.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A high power drive stack system comprising:
a common support structure having a plurality of receivers located in predetermined locations, wherein at least some of the receivers have at least one receiver contact coupled to the receiver;
a plurality of modules in a stacked configuration and secured to the common support structure, wherein the plurality of modules comprise a power component and at least one module contact, wherein the at least one module contact for each of the plurality of modules is arranged in a prescribed position based on electrical signal type and coupled to at least a portion of the power component associated with each respective module, wherein each of the module contacts of the same signal type for each of the plurality of modules are matingly coupled to corresponding receiver contacts; and
a plurality of couplers, wherein each of the plurality of couplers is selectively coupled to the receiver contacts for each of the plurality of modules based on electrical signal type to configure the plurality of modules to perform one or more high power functions, wherein at least one of the receivers has less receiver contacts than one or more other receivers.

2. The system of claim 1, further including control electronics located remotely from the common support structure and the modules, wherein the control electronics are communicatively coupled to the each of the modules to control the one or more high power functions.

3. The system of claim 1 further including a cooling system for each module.

4. The system of claim 1 further including a cooling system that is common to the plurality modules.

5. A high power electronic system formed by a plurality of power electronic modules, the system comprising:
a plurality of power electronic modules, each module having a power component and a plurality of module contacts, wherein the plurality of module contacts are arranged in a first direction in a predetermined configuration corresponding to a plurality of common signals and each module contact from one of the power electronic modules having a common signal with another module contact is arranged spaced apart from the another module contact in a second direction, wherein the second direction is perpendicular to the first direction such that the plurality of modules can be configured together to form one or more high power circuits by one or more couplers selectively coupled to the module contacts of two or more of the plurality of electronic modules in the second direction, wherein each of the plurality of couplers is coupled to one of the plurality of common signals.

6. The system of claim 5, wherein the plurality of power electronic modules are stacked together.

7. The system of claim 6, wherein the plurality of power electronic modules are configured to be stacked together in a common support structure.

8. The system of claim 5 further including a plurality of receivers for each of the plurality of power electronic modules for securing at least one of the plurality of power electronic modules to a common support structure, wherein at least some of the receivers have at least one receiver contact.

9. The system of claim 8, wherein the plurality of module contacts are configured to be removably inserted into the plurality of receiving contacts secured to the common support structure.

10. The system of claim 9, wherein the plurality of receivers are also configured to receive the one or more couplers for configuring two or more of the power electronic modules to form the one or more high power circuits.

11. The system of claim 10, wherein an electrical characteristic of one or more high power functions determines a quantity of module contacts associated with one or more of the common signals contained in a particular power electric module.

12. The system of claim 5 further including control electronics housed remotely from and communicatively coupled to the each of the plurality of power electronic modules, wherein the control electronics controls operation of the one or more power circuits.

13. The system of claim 5 further including a cooling system housed within each of the power electronic modules.

14. The system of claim 5 further including a cooling system that is common to the plurality of power electronic modules.

15. The system of claim 5, wherein each of the power electronic modules includes a housing that at least partially houses the power component and the plurality of module contacts.

16. The system of claim 15, wherein the housing for each of the plurality of power electronic modules has a substantially same size and shape.

17. A high power drive stack system comprising:
a first power electronic module comprising a first power component and a plurality of first module contacts, wherein the plurality of first module contacts are positioned based on signal type and each of the first module contacts having a different signal type are spaced apart in a first direction and the first module contacts having a common signal type are positioned spaced apart in a second direction, wherein the second direction is perpendicular to the first direction;
a second power electronic module comprising a second power component and a plurality of second module contacts, wherein the plurality of second module contacts are positioned based on signal type and each of the second module contacts having a different signal type are spaced apart in the first direction and the second module contacts having the common signal type are positioned spaced apart in the second direction;
a common support structure for securing the first power electronic module and the second power electronic module to the common support structure, wherein the common support structure comprising a plurality of receivers configured in the first direction to receive contacts from one power electronic module and the receivers are configured in the second direction to receive contacts of more than one power electronic module, wherein in the first direction each of the receivers is electrically isolated and in the second direction each of the receivers share the common signal type;

a plurality of couplers configured to selectively couple one receiver that received first module contacts with another receiver that received second module contacts to perform one or more high power functions using the first power electronic module and the second power electronic module, wherein each coupler selectively couples receivers having the common signal type in the second direction.

18. The system of claim 17, wherein a quantity of the module contacts associated with each of the power electronic modules is based on electrical signal requirements of the one or more high power functions.

19. The system of claim 17, wherein module contacts having a common signal from one of the power electronic modules form a group for each of the common signals and at least one group has fewer module contacts than another group of module contacts on the same power electronic module.

20. The system of claim 17, wherein module contacts having a common signal from one of the power electronic modules form a group for each of the common signals and at least one group has more module contacts than another group of module contacts on the same power electronic module.

21. The system of claim 17 further including control electronics located remotely from the common support structure and the modules, wherein the control electronics are communicatively coupled to each of the modules to control the one or more high power functions.

22. The system of claim 17 further including a cooling system for each module.

23. The system of claim 17 further including a cooling system that is common to the first and second electronic modules.

24. The system of claim 17, additionally including a plurality of receiver contacts, wherein one of the plurality of receiver contacts is secured to one of the plurality of receivers and the receiver contact is configured to matingly engage with the first or second module contacts to facilitate coupling one of the first power electronic module or the second power electronic module to the common support structure.

25. The system of claim 17, wherein the power electronic modules are stacked together and secured to the common support structure.

26. The system of claim 25, wherein the common support structure is a rack.

27. The system of claim 25, wherein each of the module contacts received at one of the plurality of receivers corresponds to one signal type.

* * * * *